United States Patent
Imbornone et al.

(10) Patent No.: US 6,342,813 B1
(45) Date of Patent: Jan. 29, 2002

(54) VARIABLE GAIN AMPLIFIER

(75) Inventors: James F. Imbornone, Methuen; Jean-Marc Mourant, Groton; Gregory Krzystof Szczeszynski, Marlborough, all of MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/645,298

(22) Filed: Aug. 24, 2000

(51) Int. Cl.$^7$ ................................. H03F 3/45
(52) U.S. Cl. ........................ 330/254; 330/252
(58) Field of Search ................. 330/252, 254, 330/283; 327/554

(56) References Cited

U.S. PATENT DOCUMENTS

| | | | |
|---|---|---|---|
| 4,626,808 A | * 12/1986 | Nossek | 327/553 |
| 4,644,304 A | * 2/1987 | Temes | 327/553 |
| 4,855,685 A | 8/1989 | Horchschild | 330/282 |
| 5,412,346 A | 5/1995 | Burger, Jr. et al. | 330/282 |
| 5,684,431 A | 11/1997 | Gilbert et al. | 330/254 |
| 6,023,192 A | * 2/2000 | Didier | 330/254 |
| 6,031,421 A | 2/2000 | McEwan | 330/10 |
| 6,035,049 A | 3/2000 | Engh et al. | 381/121 |

* cited by examiner

Primary Examiner—Robert Pascal
Assistant Examiner—Khanh V. Nguyen
(74) Attorney, Agent, or Firm—Ratner & Prestia; Joseph P. Abate, Esq.

(57) ABSTRACT

An amplifier in which the gain is changed by changing the reactance in the emitter of a transistor and this change in reactance is compensated for by changing the reactance in a feedback path between the collector and the base of the transistor to maintain the input impedance to the amplifier fixed.

12 Claims, 2 Drawing Sheets

VARIABLE GAIN AMPLIFIER

TECHNICAL FIELD

The present invention relates, in general, to variable gain amplifiers and, in particular, to an amplifier in which the gain is varied by varying the input impedance.

BACKGROUND OF THE INVENTION

Variable gain is required in a radio frequency amplifier. This variable gain usually is made up of a combination of continuous gain (i.e., analog variable) or discrete gain (i.e., digitally variable).

Continuously variable gain, as in an analog variable gain circuit, is typically used to achieve instantaneous dynamic range or to compensate for temperature variations. Discretely variable gain, on the other hand, is typically used to compensate for process variations by adjusting the gain of the radio frequency transmitter at the factory. The capability to adjust the gain of the radio frequency transmitter in discrete steps is used to compensate for not only the process variations in the transmit chip but also any off chip components, such as filters and power amplifiers.

Conventional methods of achieving discrete gain variation involve using a switch and resistor arrangement as in a step attenuator. The drawbacks of a conventional step attenuator are noise and power dissipation.

SUMMARY OF THE INVENTION

It is an objective of the present invention to provide a new an improved variable gain amplifier.

It is another objective of the present invention to provide a variable gain amplifier having an improved dynamic range.

It is a further objective of the present invention to provide a variable gain amplifier in which linearity is maintained over the dynamic range.

It is yet another objective of the present invention to provide a variable gain amplifier in which the output match remains constant over the dynamic range to maintain monotonicity, namely the gain is either continuously increasing or decreasing versus a continuously increasing or decreasing control.

An amplifier having a variable gain and a fixed input impedance, constructed in accordance with the present invention, includes a transistor having a base, a collector and an emitter and an inductor coupled to the emitter of the transistor. This amplifier also has a first plurality of reactance/switch pairs connected in parallel with the inductor and a second plurality of reactance/switch pairs connected in parallel between the collector and the base of the transistor. An amplifier having a variable gain and a fixed input impedance, constructed in accordance with the present invention, further includes means for closing a selected switch of the first plurality of reactance/switch pairs to change the gain of the amplifier and a selected switch of the second plurality of reactance/switch pairs to maintain the input impedance of the amplifier fixed.

A differential amplifier having a variable gain and a fixed input impedance, constructed in accordance with the present invention, includes a first transistor having a base, a collector and an emitter, a second transistor having a base, a collector and an emitter; a first inductor coupled to the emitter of the first transistor; and a second inductor coupled to the emitter of the second transistor This differential amplifier also includes a first plurality of reactance/switch pairs connected in series with the first inductor with the series connections of the first inductor and the first plurality of reactance/switch pairs connected in parallel with the second inductor and with the second inductor with the series connections of the second inductor and the first plurality of reactance/switch pairs connected in parallel with the first inductor. A differential amplifier having a variable gain and a fixed input impedance, constructed in accordance with the present invention, further includes a second plurality of reactance/switch pairs connected in parallel between the collector and the base of the first transistor and a third plurality of reactance/switch pairs connected in parallel between the collector and the base of the second transistor. This differential amplifier also includes means for closing a selected switch of the first plurality of reactance/switch pairs to change the gain of the differential amplifier and a selected switch of the second plurality of reactance/switch pairs and a selected switch of the third plurality of reactance/switch pairs to maintain the input impedance of the differential amplifier fixed.

BRIEF DESCRIPTION OF THE DRAWINGS

The present invention will be best understood from the following detailed description when read in conjunction with the accompanying drawings.

DETAILED DESCRIPTION OF THE INVENTION

Figure 1:
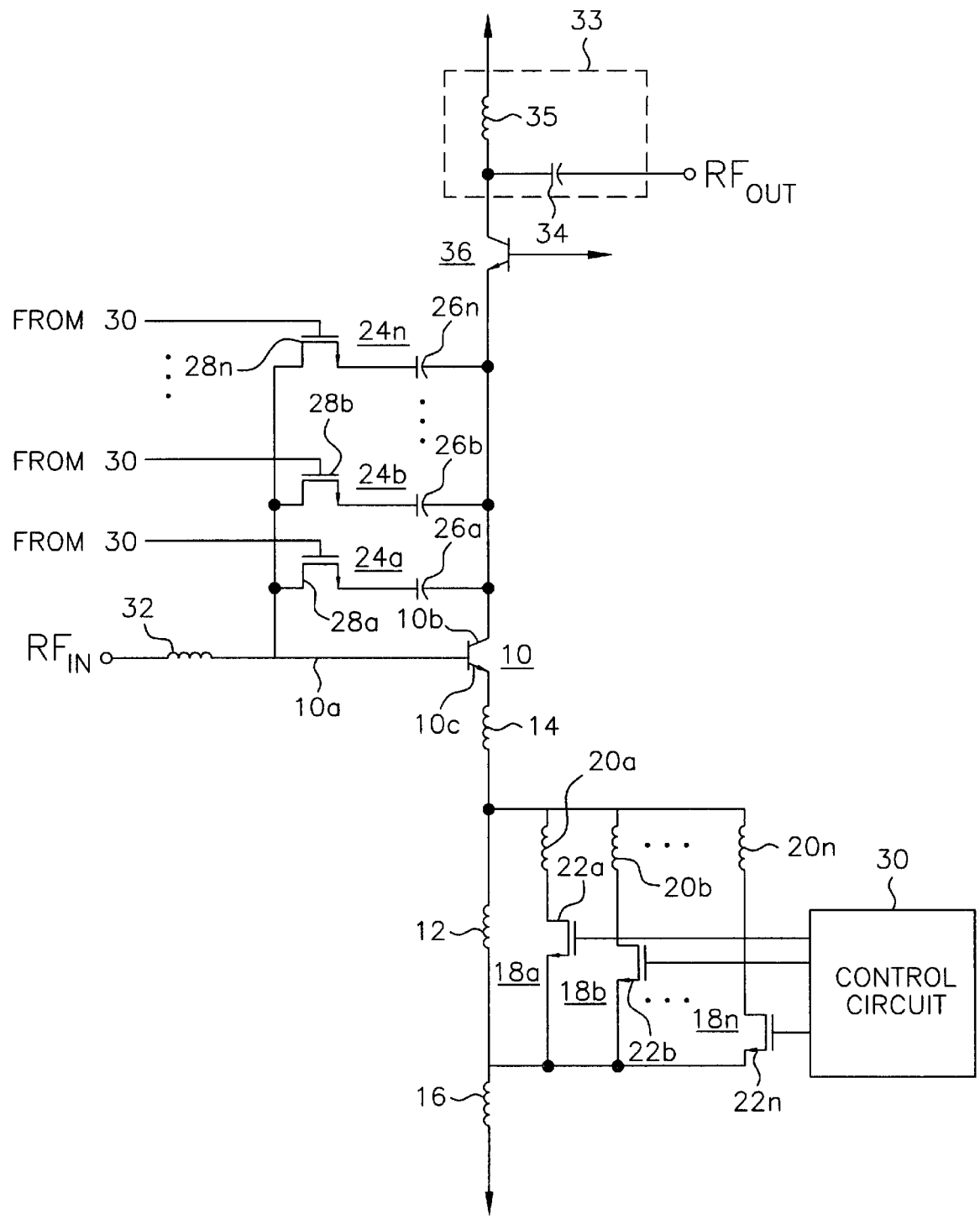
FIG. 1 is a circuit diagram of a variable gain amplifier constructed in accordance with the present invention.

Referring to FIG. 1, a variable gain amplifier, constructed in accordance with the present invention includes a transistor 10 having a base 10a, a collector 10b and an emitter 10c.

This variable gain amplifier also includes an inductor 12 coupled to emitter 10c of transistor 10. An inductor 14, shown between inductor 12 and emitter 10c of transistor 10, represents residual or parasitic inductance and an inductor 16, shown between inductor 12 and ground, also represents residual or parasitic inductance.

The variable gain amplifier of FIG. 1 further includes a first plurality of reactance/switch pairs connected in parallel with first inductor 12. For the embodiment of the invention being described, the first plurality of reactance/switch pairs is a plurality of inductor/switch pairs 18a, 18b ... 18n. Each of the plurality of inductor/switch pairs 18a, 18b ... 18n includes an inductor 20a, 20b ... 20n and a switch 22a, 22b ... 22n in series. Each switch 22a, 22b ... 22n preferably is a MOSFET device.

A variable gain amplifier, constructed in accordance with the present invention, also includes a second plurality of reactance/switch pairs connected in parallel between collector 10b and base 10a of transistor 10. For the embodiment of the invention being described, the second plurality of reactance/switch pairs is a plurality of capacitor/switch pairs 24a, 24b ... 24n. Each of the plurality of capacitor/switch pairs 24a, 24b ... 24n is associated with one of the plurality of inductor/switch pairs 18a, 18b ... 18n for the embodiment of the invention being described. Each of the plurality of capacitor/switch pairs 24a, 24b ... 24n includes a capacitor 26a, 26b ... 26n and a switch 28a, 28b ... 28n connected in series. Each switch 28a, 28b ... 28n preferably is a MOSFET device.

The FIG. 1 variable gain amplifier further includes means for closing a selected switch of the plurality of inductor/switch pairs 18a, 18b . . . 18n to change the gain of the amplifier and a selected switch of the plurality of capacitor/switch pairs 24a, 24b . . . 24n associated with the switch of the plurality of inductor/switch pairs that is closed to maintain the input impedance of the amplifier fixed. Such means are represented in FIG. 1 by a control circuit 30. As an inductor 20a, 20b . . . 20n is selected to establish the gain of the amplifier by control signals from control circuit 30 that close the switch 18a, 18b . . . 18b associated with the selected inductor, that switch in the capacitor/switch pairs 24a, 24b . . . 24n associated with the selected inductor also is closed by control signals from control circuit 30 to include the associated capacitor in the feedback path and compensate for the change in the input impedance caused by the selection of the particular inductor 20a, 20b . . . 20n.

It should be noted that the desired gain of the amplifier can be established by selecting one or more inductors 20a, 20b . . . 20n and the desired compensation to maintain the input impedance fixed can be achieved by selecting one or more capacitors 26, 26b . . . and 26n. In other words, there need not be a one-to-one association between inductors 20a, 20b . . . 20n and capacitors 26, 26b . . . and 26n. Instead, the inductors and capacitors can be selected in groups by appropriate control signals supplied from control circuit 30 to establish the desired the gain of the amplifier, while maintaining the input impedance of the amplifier fixed. A one-to-one association between inductors 20a, 20b . . . 20n and capacitors 26, 26b . . . and 26n simplifies the logic of control circuit 30. The number of components needed to establish the desired gain while maintaining the input impedance fixed can be reduced if the necessary emitter circuit inductance and feedback circuit capacitance can be realized by the selection of groups of inductors and groups of capacitors.

Also, the reactances in the emitter circuit and the feedback circuit of this variable gain amplifier need not be strictly inductors and capacitors, respectively. These reactances, for example, can be combinations of inductors and capacitors.

The FIG. 1 variable gain amplifier also includes a fourth inductor 32 connected to base 10a of transistor 10 through which an input radio frequency signal $RF_{IN}$ is conducted. Inductor 32 contributes to the matching between the variable gain amplifier and the preceding stage.

The FIG. 1 variable gain amplifier also includes a matching network 33 coupled to collector 10b of transistor 10 and composed of a capacitor 34 through which an output radio frequency signal RFoUT is conducted and an inductor 35. Capacitor 35 contributes to the matching between the variable gain amplifier and the following stage.

In addition, the FIG. 1 variable gain amplifier also includes a second transistor 36 connected between matching network 33 and collector 10b of transistor 10. Transistor 36 provides extra gain to and isolation of the variable gain amplifier of FIG. 1.

The correct switching logic from control circuit 30 is required to ensure that the proper amount of collector-base feedback capacitance in the circuit of transistor 10 is used for a given amount of emitter inductance of the circuit of transistor 10. This is accomplished by ensuring that only the minimum feedback capacitance is used when the minimum inductance is selected. Conversely, the maximum feedback capacitance is used when the maximum inductance is selected.

By using a variable gain amplifier with lossless feedback, in accordance with the present invention, the transmit dynamic range is improved. In other words, the noise figure does not increase linearly with gain reduction as is the case with a passive step attenuator. Constant current is used to maintain linearity over the dynamic range. The output match remains constant over the dynamic range to maintain monotonicity. Monotonicity is important as it enables a more intelligent gain setting algorithm. In the present invention, monotonicity is maintained by ensuring the output match remains constant.

Figure 2:
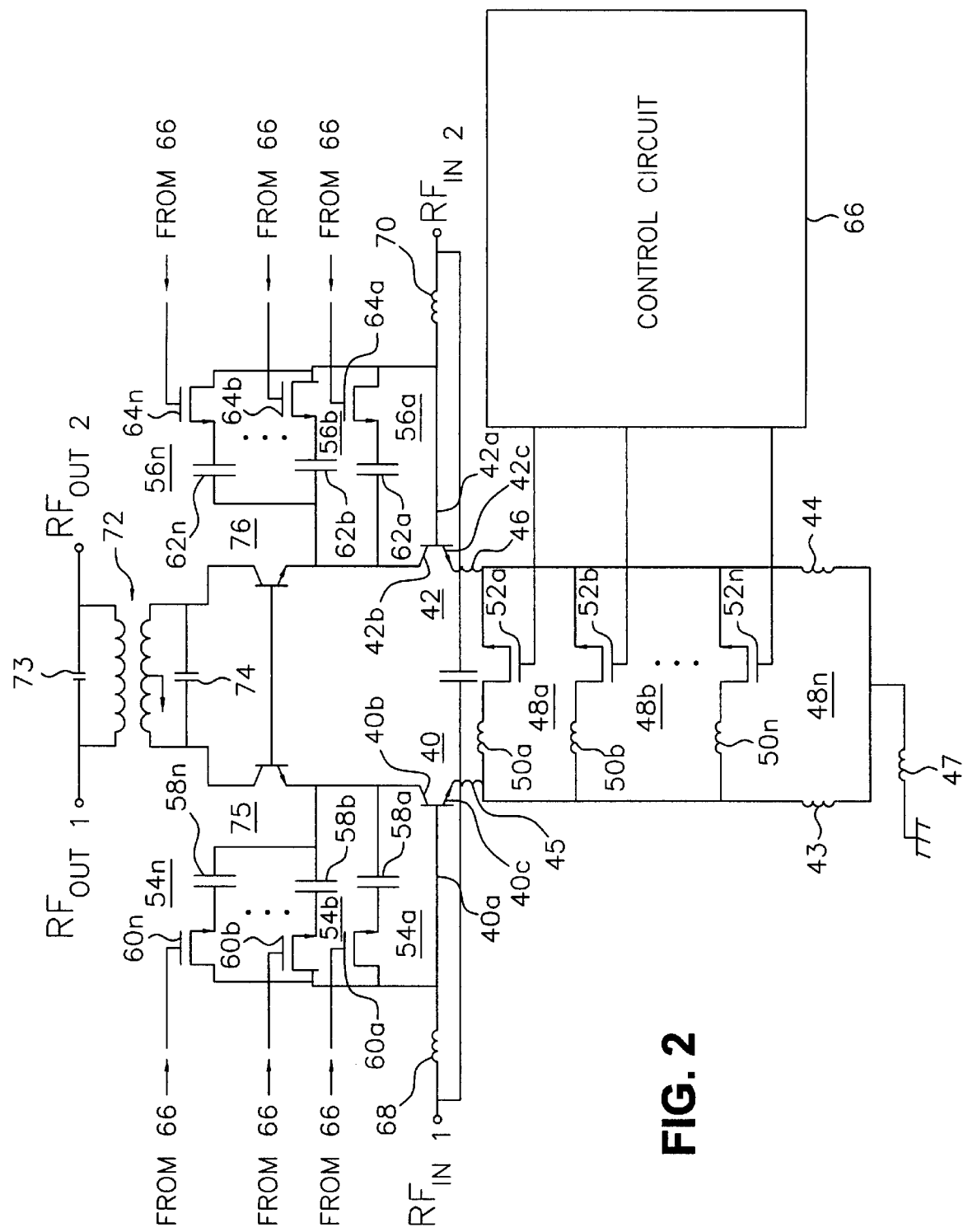
FIG. 2 is a circuit diagram of a differential variable gain amplifier constructed in accordance with the present invention.

Referring to FIG. 2, a differential variable gain amplifier, constructed in accordance with the present invention, includes a first transistor 40 having a base 40a, a collector 40b and an emitter 40c and a second transistor 42 having a base 42a, a collector 42b and an emitter 42c.

This differential variable gain amplifier also includes a first inductor 43 coupled to emitter 40c of first transistor 40 and a second inductor 44 coupled to emitter 42c of second transistor 42. An inductor 45, shown between inductor 43 and emitter 40c of transistor 40, an inductor 46, shown between inductor 44 and emitter 42c of transistor 42 and an inductor 47, shown between ground and inductors 43 and 44, represents residual or parasitic inductance.

The differential variable gain amplifier of FIG. 2 further includes a first plurality of reactance/switch pairs connected in series with first inductor 43 with the series connections of the first inductor and the first plurality of reactance/switch pairs connected in parallel with second inductor 44 and also connected in series with second inductor 44 with the series connections of the second inductor and the first plurality of reactance/switch pairs connected in parallel with first inductor 43. For the embodiment of the invention being described, the first plurality of reactance/switch pairs is a plurality of inductor/switch pairs 48a, 48b . . . 48n. Each of the plurality of inductor/r switch pairs 48a, 48b . . . 48n includes an inductor 50a, 50b . . . 50n and a switch 52a, 52b . . . 50n connected in series. Each switch 52a, 52b . . . 52n preferably is a MOSFET device.

A differential variable gain amplifier, constructed in accordance with the present invention, also includes a second plurality of reactance switch pairs connected in parallel between collector 40b and base 40a of first transistor 40 and a second plurality of reactance/switch pairs connected in parallel between collector 42b and base 42a of second transistor 42. For the embodiment of the invention being described, the second plurality of reactance/switch pairs is a plurality of capacitor/switch pairs 54a, 54b . . . 54n and the third plurality of reactance/switch pairs is a plurality capacitor/switch pairs 56a, 56b . . . 56n. For this embodiment of the invention, each of the capacitor/switch pairs of the second plurality of capacitor/switch pairs is associated with one of the plurality of inductor/switch pairs 48a, 48b . . . 48n and each of capacitor/switch pairs of the third plurality of capacitor/switch pairs is associated with one of the plurality of inductor/switch pairs 48a, 48b . . . 48n. Each of the plurality of capacitor/switch pairs 54a, 54b . . . 54n includes a capacitor 58a, 58b . . . 58n and a switch 60a, 60b . . . 60n connected in series. Each switch 60a, 60b . . . 60n preferably is a MOSFET device. Each of the plurality of capacitor/switch pairs 56a, 56b . . . 56n includes a capacitor 62a, 62b . . . 62n and a switch 64a, 64b . . . 64n connected in series. Each switch 64a, 64b . . . 64n preferably is a MOSFET device.

The FIG. 2 differential variable gain amplifier further includes means for closing a selected switch of the plurality of inductor/switch pairs 48a, 48b . . . 48n to change the gain of the differential amplifier and a selected switch of the plurality of capacitor/switch pairs 54a, 54b . . . 54n associated with the switch of the plurality of inductor/switch pairs that is closed and a selected switch of the plurality of capacitor/switch pairs 56a, 56b . . . 56n associated with the switch of the plurality of inductor/switch pairs that is closed to maintain the input impedance of the differential amplifier fixed. Such means are represented in FIG. 2 by a control circuit 66. As an inductor 50a, 50b . . . 50n is selected to establish the gain of the differential amplifier by control signals from control circuit 66 that close the switch 52a, 52b . . . 52b associated with the selected inductor, those switches in the capacitor/switch pairs 54a, 54b . . . 54n associated with the selected inductor and those switches in the capacitor/switch pairs 56a, 56b . . . 56n associated with the selected inductor also are closed by control signals from control circuit 66 to include the associated capacitors in the feedback paths and compensate for the change in the input impedance caused by the selection of the particular inductor 50a, 50b . . . 50n.

As with the FIG. 1 embodiment of the present invention, it should be noted that the desired gain of the differential amplifier can be established by selecting one or more inductors 50a, 50b . . . 50n and the desired compensation to maintain the input impedance fixed can be achieved by selecting one or more capacitors one or more capacitors 58a, 58b . . . and 58n and one or more capacitors 62a, 62b . . . and 62n. In other words, there need not be a one-to-one association between inductors 50a, 50b . . . 50n and capacitors 58a, 58b . . . and 58n and a one-to-one association between inductors 50a, 50b . . . 50n and capacitors 62a, 62b . . . and 62n. Instead, the inductors and the capacitors can be selected in groups by appropriate control signals supplied from control circuit 66 to establish the desired gain of the amplifier, while maintaining the input impedance of the differential amplifier fixed. A one-to-one association between inductors 50a, 50b . . . 50n and capacitors 58a, 58b . . . and 58n and a one-to-one association between inductors 50a, 50b and capacitors 62a, 62b . . . and 62n simplifies the logic of control circuit 66. The number of components needed to establish the desired gain while maintaining the input impedance fixed can be reduced if the necessary emitter circuit inductance and feedback circuit capacitance can be realized by the selection of groups of inductors and groups of capacitors.

As with the FIG. 1 embodiment of the present invention, the reactances in the emitter circuit and the feedback circuit need not be strictly inductors and capacitors, respectively. These reactances, for example, can be combinations of inductors and capacitors.

The FIG. 2 differential variable gain amplifier also includes a third inductor 68 connected to base 40a of first transistor 40 through which an input radio frequency signal $RF_{IN}$ is conducted and a fourth inductor 70 connected to base 42a of second transistor 42 through which the input radio frequency signal $RF_{IN}$ is conducted. Inductors 68 and 70 contribute to the matching between the differential variable gain amplifier and the preceding stage.

Also included in the FIG. 2 differential variable gain amplifier is a balun 72 coupled to collector 40b of transistor 40 and to collector 42b of transistor 42 through which an output radio frequency signal $RF_{OUT}$ is conducted. Balun 72, a capacitor 73 and a capacitor 74 contribute to the matching between the differential variable gain amplifier and the following stage.

In addition, the FIG. 2 differential variable gain amplifier includes a third transistor 75 connected between balun 72 and collector 40b of first transistor 40 and a fourth transistor 76 connected between balun 72 and collector 42b of second transistor 42.

The correct switching logic from control circuit 66 is required to ensure that the proper amount of collector-base feedback capacitance in the circuits of transistors 40 and 42 is used for a given amount of emitter inductance of the circuits of transistors 40 and 42. This is accomplished by ensuring that only the minimum feedback capacitance is used when the minimum inductance is selected. Conversely, the maximum feedback capacitance is used when the maximum inductance is selected.

Again, by using a variable gain amplifier with lossless feedback, in accordance with the present invention, the transmit dynamic range is improved. In other words, the noise figure does not increase linearly with gain reduction as is the case with a passive step attenuator. Constant current is used to maintain linearity over the dynamic range. The output match remains constant over the dynamic range to maintain monotonicity. Monotonicity is important as it enables a more intelligent gain setting algorithm. In the present invention, monotonicity is maintained by ensuring the output match remains constant. In the differential variable gain amplifier of the present invention, this is done by buffering the common emitter variable feedback amplifier from the differential variable gain amplifier output by using a common-base amplifier.

Although described and illustrated above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An amplifier having a variable gain and a fixed input impedance comprising:
   a transistor having a base, a collector and an emitter;
   an inductor coupled to said emitter of said transistor;
   a plurality of inductor/switch pairs connected in parallel with said inductor;
   a plurality of capacitor/switch pairs connected in parallel between said collector and said base of said transistor; and
   means for closing:
   (a) a selected switch of said plurality of inductor/switch pairs to change the gain of said amplifier, and
   (b) a selected switch of said plurality of capacitor/switch pairs to maintain the input impedance of said amplifier fixed.

2. An amplifier according to claim 1 wherein:
   (a) each of said plurality of inductor/switch pairs includes an inductor and a switch connected in series, and
   (b) each of said plurality of capacitor/switch pairs includes a capacitor and a switch connected in series.

3. An amplifier according to claim 2 further including:
   (a) a second inductor connected to said base of said transistor through which an input radio frequency signal is conducted, and
   (b) a capacitor coupled to said collector of said transistor through which an output radio frequency signal is conducted.

4. An amplifier according to claim 3 further including a second transistor connected between said capacitor and said collector of said first transistor.

5. An amplifier according to claim 4 wherein said switches are MOSFET devices.

6. A differential amplifier having a variable gain and a fixed input impedance comprising:
   a first transistor having a base, a collector and an emitter;
   a second transistor having a base, a collector and an emitter;
   a first inductor coupled to said emitter of said first transistor;
   a second inductor coupled to said emitter of said second transistor;
   a plurality of inductor/switch pairs connected in series with:
      (a) said first inductor with said series connections of said first inductor and said plurality of inductor/switch pairs connected in parallel with said second inductor, and
      (b) said second inductor said series connections of said second inductor and said plurality of inductor/switch pairs connected in parallel with said first inductor;
   first plurality of capacitor/switch pairs connected in parallel between said collector and said base of said first transistor;
   a second plurality of capacitor/switch pairs connected in parallel between said collector and said base of said second transistor; and
   means for closing:
      (a) a selected switch of said plurality of inductor/switch pairs to change the gain of said differential amplifier,
      (b) a selected switch of said first plurality of capacitor/switch pairs and a selected switch of said second plurality of capacitor/switch pairs to maintain the input impedance of said differential amplifier fixed.

7. A differential amplifier according to claim 6 wherein:
   (a) each of said plurality of inductor/switch pairs includes an inductor and a switch connected in series,
   b) each of said first plurality of capacitor/switch pairs includes a capacitor and a switch connected in series, and
   (c) each of said second plurality of capacitor/switch pairs includes a capacitor and a switch connected in series.

8. A differential amplifier according to claim 7 further including:
   (a) a third inductor connected to said base of said first transistor through which an input radio frequency signal is conducted,
   (b) a fourth inductor connected to said base of said second transistor through which the input radio frequency signal is conducted, and
   (c) a balun coupled to said collector of said first transistor and to said collector of said second transistor through which an output radio frequency signal is conducted.

9. A differential amplifier according to claim 8 further including:
   (a) a third transistor connected between said balun and said collector of said first transistor, and
   (b) a fourth transistor connected between said balun and said collector of said second transistor.

10. A differential amplifier according to claim 9 wherein said switches are MOSFET devices.

11. An amplifier having a variable gain and a fixed input impedance comprising:
   a transistor having a base, a collector and an emitter;
   an inductor coupled to said emitter of said transistor;
   a first plurality of reactance/switch pairs connected in parallel with said inductor;
   a second plurality of reactance/switch pairs connected in parallel between said collector and said base of said transistor; and
   means for closing:
      (a) a selected switch of said first plurality of reactance/switch pairs to change the gain of said amplifier, and
      (b) a selected switch of said second plurality of reactance/switch pairs to maintain the input impedance of said amplifier fixed.

12. A differential amplifier having a variable gain and a fixed input impedance comprising:
   a first transistor having a base, a collector and an emitter;
   a second transistor having a base, a collector and an emitter;
   a first inductor coupled to said emitter of said first transistor;
   a second inductor coupled to said emitter of said second transistor;
   a first plurality of reactance/switch pairs connected in series with:
      (a) said first inductor with said series connections of said first inductor and said first plurality of reactance/switch pairs connected in parallel with said second inductor, and
      (b) said second inductor with said series connections of said second inductor and said first plurality of reactance/switch pairs connected in parallel with said first inductor;
   a second plurality of reactance/switch pairs connected in parallel between said collector and said base of said first transistor;
   a third plurality of reactance/switch pairs connected in parallel between said collector and said base of said second transistor; and
   means for closing:
      (a) a selected switch of said first plurality of reactance/switch pairs to change the gain of said differential amplifier,
      (b) a selected switch of said second plurality of reactance/switch pairs and a selected switch of said third plurality of reactance/switch pairs to maintain the input impedance of said differential amplifier fixed.

* * * * *